US011658254B2

(12) United States Patent
Najafi et al.

(10) Patent No.: US 11,658,254 B2
(45) Date of Patent: May 23, 2023

(54) COMPLEMENTARY METAL-OXIDE SEMICONDUCTOR COMPATIBLE PATTERNING OF SUPERCONDUCTING NANOWIRE SINGLE-PHOTON DETECTORS

(71) Applicant: PSIQUANTUM CORP., Palo Alto, CA (US)

(72) Inventors: Faraz Najafi, San Jose, CA (US); Mark Thompson, Palo Alto, CA (US); Damien Bonneau, Bristol (GB); Joaquin Matres Abril, Palo Alto, CA (US)

(73) Assignee: PSIQUANTUM CORP., Palo Alto, CA (US)

( * ) Notice: Subject to any disclaimer, the term of this patent is extended or adjusted under 35 U.S.C. 154(b) by 0 days.

(21) Appl. No.: 17/688,769

(22) Filed: Mar. 7, 2022

(65) Prior Publication Data

US 2022/0262969 A1 Aug. 18, 2022

Related U.S. Application Data

(60) Division of application No. 16/848,662, filed on Apr. 14, 2020, now Pat. No. 11,271,125, which is a (Continued)

(51) Int. Cl.
*H01L 31/0352* (2006.01)
*H01L 31/18* (2006.01)
(Continued)

(52) U.S. Cl.
CPC ........ *H01L 31/035227* (2013.01); *G01J 1/42* (2013.01); *G01J 1/44* (2013.01);
(Continued)

(58) Field of Classification Search
CPC ................... G01J 2001/442; H01L 31/035227
See application file for complete search history.

(56) References Cited

U.S. PATENT DOCUMENTS 9,500,519 B2 * 11/2016 Tang .................... G02B 6/0229
2011/0108803 A1 5/2011 Deligianni et al.
(Continued)

FOREIGN PATENT DOCUMENTS

WO WO 2012/052628 A2 4/2012
WO WO 2017/213648 A1 12/2017

OTHER PUBLICATIONS

Psiquantum Corp., International Search Report / Written Opinion, PCT/US2018/066912, dated Apr. 16, 2019, 21 pgs.
(Continued)

*Primary Examiner* — Raj R Gupta
(74) *Attorney, Agent, or Firm* — Morgan, Lewis & Bockius LLP

(57) ABSTRACT

A device includes a first semiconductor layer; a portion of a second semiconductor layer disposed on the first semiconductor layer; and a third semiconductor layer including a first region disposed on the portion of the second semiconductor layer and a second region disposed on the first semiconductor layer. A thickness of the first region is less than a predefined thickness. The device also includes an etch stop layer disposed on the third semiconductor layer; a plurality of distinct portions of a fourth semiconductor layer disposed on the etch stop layer and exposing one or more distinct portions of the etch stop layer over the portion of the second semiconductor layer; and a plurality of distinct portions of a superconducting layer disposed on the plurality of distinct portions of the fourth semiconductor layer and the exposed one or more distinct portions of the etch stop layer.

6 Claims, 25 Drawing Sheets

Related U.S. Application Data continuation of application No. 16/228,441, filed on Dec. 20, 2018, now Pat. No. 10,651,325.

(60) Provisional application No. 62/608,524, filed on Dec. 20, 2017.

(51) Int. Cl.
| | | |
|---|---|---|
| *H01L 31/0232* | (2014.01) | |
| *H01L 31/109* | (2006.01) | |
| *H01L 39/24* | (2006.01) | |
| *G01J 1/42* | (2006.01) | |
| *H01L 39/10* | (2006.01) | |
| *G01J 1/44* | (2006.01) | |

(52) U.S. Cl.
CPC ...... *H01L 31/02327* (2013.01); *H01L 31/109* (2013.01); *H01L 31/18* (2013.01); *H01L 39/10* (2013.01); *H01L 39/24* (2013.01); *H01L 39/2416* (2013.01); *G01J 2001/442* (2013.01)

(56) References Cited

U.S. PATENT DOCUMENTS

| | | | |
|---|---|---|---|
| 2017/0098752 A1* | 4/2017 | You | H01L 31/02165 |
| 2018/0033944 A1* | 2/2018 | Ladizinsky | H01L 39/125 |
| 2018/0374979 A1 | 12/2018 | Nozawa | |
| 2019/0288132 A1 | 9/2019 | Wang et al. | |

OTHER PUBLICATIONS

Najafi, Notice of Allowance, U.S. Appl. No. 16/228,441, dated Jan. 13, 2020, 7 pgs.

Psiquantum Corp., International Preliminary Report on Patentability, PCT/US2018/066912, dated Jun. 23, 2020, 16 pgs.

Najafi, Restriction Requirement, U.S. Appl. No. 16/848,662, dated May 13, 2021, 8 pgs.

Najafi, Notice of Allowance, U.S. Appl. No. 16/848,662, dated Oct. 27, 2021, 9 pgs.

* cited by examiner 100-1

100-1

100-1

100-1

100-2

100-2

100-2

100-2

100-2

400A

402 Obtain a first device with:
  a first semiconductor oxide layer;
  a portion of a semiconductor layer disposed on the first semiconductor oxide layer;
  a second semiconductor oxide layer including a first region disposed on the portion of the semiconductor layer and a second region disposed on the first semiconductor oxide layer, wherein a thickness of the first region of the second semiconductor oxide layer is less than a first predefined thickness;
  an etch stop layer disposed on the second semiconductor oxide layer; and
  a third semiconductor oxide layer disposed on the etch stop layer, wherein a thickness of the third semiconductor oxide layer is at least a second predefined thickness

---

404 The first device is configured such that
  removing portions of the third semiconductor oxide layer to define a plurality of distinct portions of the third semiconductor oxide layer and to expose one or more distinct portions of the etch stop layer, and
  depositing, on the plurality of distinct portions of the third semiconductor oxide layer and the one or more distinct exposed portions of the etch stop layer, a superconducting layer
  forms a plurality of distinct portions of the superconducting layer disposed respectively on the plurality of distinct portions of the third semiconductor oxide layer and on the one or more distinct exposed portions of the etch stop layer

---

406 The etch stop layer and the third semiconductor oxide layer are configured so that one or more portions of the third semiconductor oxide layer are removable without exposing corresponding portions of the second semiconductor oxide layer (A)

Figure 4A

402 Obtain a first device with:
   a first semiconductor oxide layer;
   a portion of a semiconductor layer disposed on the first semiconductor oxide layer;
   a second semiconductor oxide layer including a first region disposed on the portion of the semiconductor layer and a second region disposed on the first semiconductor oxide layer, wherein a thickness of the first region of the second semiconductor oxide layer is less than a first predefined thickness;
   an etch stop layer disposed on the second semiconductor oxide layer; and
   a third semiconductor oxide layer disposed on the etch stop layer, wherein a thickness of the third semiconductor oxide layer is at least a second predefined thickness (A)

408 Obtaining the first device includes:
   obtaining a second device with the first semiconductor oxide layer, the portion of the semiconductor layer, and the second semiconductor oxide layer;
   depositing the etch stop layer on the second semiconductor oxide layer; and
   depositing the third semiconductor oxide layer on the etch stop layer.

410 Obtaining the second device includes:
   obtaining a third device with the first semiconductor oxide layer;
   depositing the semiconductor layer on the first semiconductor oxide layer;
   removing one or more portions of the semiconductor layer to define the portion of the semiconductor layer and to expose the one or more portions of the first semiconductor oxide layer; and
   after removing the one or more portions of the semiconductor layer, depositing the second semiconductor oxide layer 412 Obtaining the second device includes, after depositing the second semiconductor oxide layer, processing the second semiconductor oxide layer to have a substantially flat surface 414 The third device includes a substrate, and obtaining the third device includes depositing the first semiconductor oxide layer over the substrate (B)

Figure 4B

402 Obtain a first device with:
    a first semiconductor oxide layer;
    a portion of a semiconductor layer disposed on the first semiconductor oxide layer;
    a second semiconductor oxide layer including a first region disposed on the portion of the semiconductor layer and a second region disposed on the first semiconductor oxide layer, wherein a thickness of the first region of the second semiconductor oxide layer is less than a first predefined thickness;
    an etch stop layer disposed on the second semiconductor oxide layer; and
    a third semiconductor oxide layer disposed on the etch stop layer, wherein a thickness of the third semiconductor oxide layer is at least a second predefined thickness (B)

416 The predefined thickness is 100 nm

418 A width of a respective portion of the superconducting layer disposed on a corresponding exposed portion of the etch stop layer is 100 nm

420 A thickness of the third semiconductor oxide layer is at least 500 nm

422 The portion of the semiconductor layer is 200 nm in thickness

424 The portion of the semiconductor layer is a waveguide

426 The semiconductor layer is a silicon layer

Figure 4C

430 Obtain a device with:
   a first semiconductor oxide layer;
   a portion of a semiconductor layer disposed on the first semiconductor oxide layer;
   a second semiconductor oxide layer including a first region disposed on the portion of the semiconductor layer and a second region disposed on the first semiconductor oxide layer, wherein a thickness of the first region of the second semiconductor oxide layer is less than a first predefined thickness;
   an etch stop layer disposed on the second semiconductor oxide layer; and
   a plurality of distinct portions of a third semiconductor oxide layer disposed on the etch stop layer and exposing one or more distinct portions of the etch stop layer, wherein a thickness of the third semiconductor oxide layer is at least a second predefined thickness (C)

436 The device includes a substrate. The first semiconductor oxide layer is disposed over the substrate 438 Obtaining the device includes:
   obtaining a second device with:
      the first semiconductor oxide layer;
      the portion of the semiconductor layer disposed on the first semiconductor oxide layer;
      the second semiconductor oxide layer including the first region disposed on the portion of the semiconductor layer and the second region disposed on the first semiconductor oxide layer;
      the etch stop layer disposed on the first semiconductor oxide layer; and
      the third semiconductor oxide layer; and
   removing portions of the third semiconductor oxide layer to define the plurality of distinct portions of the third semiconductor oxide layer and to expose the one or more distinct portions of the etch stop layer 440 The predefined thickness is 100 nm 442 A width of a respective portion of the superconducting layer disposed on a corresponding exposed portion of the etch stop layer is 100 nm (D)

Figure 4E

430 Obtain a device with:
   a first semiconductor oxide layer;
   a portion of a semiconductor layer disposed on the first semiconductor oxide layer;
   a second semiconductor oxide layer including a first region disposed on the portion of the semiconductor layer and a second region disposed on the first semiconductor oxide layer, wherein a thickness of the first region of the second semiconductor oxide layer is less than a first predefined thickness;
   an etch stop layer disposed on the second semiconductor oxide layer; and
   a plurality of distinct portions of a third semiconductor oxide layer disposed on the etch stop layer and exposing one or more distinct portions of the etch stop layer, wherein a thickness of the third semiconductor oxide layer is at least a second predefined thickness (D)

444 A thickness of the third semiconductor oxide layer is at least 500 nm

446 The portion of the semiconductor layer is 200 nm in thickness

448 The portion of the semiconductor layer is a waveguide

450 The semiconductor layer is a silicon layer

530 Obtain a device with:
 a first semiconductor oxide layer;
 a portion of a semiconductor layer disposed on the first semiconductor oxide layer; and
 a second semiconductor oxide layer including a first region disposed on the portion of the semiconductor layer and a second region disposed on the first semiconductor oxide layer, wherein a thickness of the first region of the second semiconductor oxide layer is less than a predefined thickness > 532 The device includes a substrate, and the first semiconductor oxide layer is disposed over the substrate > 534 The predefined thickness is 100 nm > 536 The portion of the semiconductor layer is 200 nm in thickness > 538 The portion of the semiconductor layer is a waveguide > 540 The semiconductor layer is a silicon layer

542 Deposit a superconducting layer on the device

544 Remove one or more portions of the superconducting layer to define one or more distinct portions of the superconducting layer to produce a superconducting nanowire single-photon detector

Figure 5B

COMPLEMENTARY METAL-OXIDE SEMICONDUCTOR COMPATIBLE PATTERNING OF SUPERCONDUCTING NANOWIRE SINGLE-PHOTON DETECTORS

RELATED APPLICATIONS

This application is a divisional application of U.S. application Ser. No. 16/848,662, filed Apr. 14, 2020, which is a continuation application of U.S. patent application Ser. No. 16/228,441, filed Dec. 20, 2018, now U.S. Pat. No. 10,651,325, which claims the benefit of, and priority to, U.S. Provisional Application Ser. No. 62/608,524, filed Dec. 20, 2017, each of which is incorporated by reference herein in its entirety.

TECHNICAL FIELD

This relates generally to fabrication of superconducting photonic devices, including but not limited to waveguide-integrated superconducting nanowire single-photon detectors.

BACKGROUND

The integration of photonics and superconducting electronics is emerging as a central challenge for quantum photonic and low-power computing platforms. The sensitivity of superconducting electronic components to fabrication defects has been a limiting factor in achieving high yield in integrated systems of superconductors and complementary metal-oxide semiconductor (CMOS) compatible components.

Monolithic integration schemes for superconducting detectors with photonic circuits generally involve forming the detector structures before forming the rest of the photonic circuit. However, the superconducting detector structures are delicate and can be damaged by subsequent processing. Thus, fabrication methods that involve performing further processing steps after the superconducting structures have been formed can result in low yield of properly formed and operational superconducting structures.

As an additional challenge, performing the detector fabrication can introduce new (superconducting) materials into a fabrication facility, particularly for a CMOS fabrication facility. Introduction of the new materials makes it more difficult for the fabrication facility to comply with contamination standards. In addition, the additional fabrication steps can interrupt standard CMOS fabrication flows and reduce production efficiency.

SUMMARY

Accordingly, there is a need for a device fabrication process in which superconducting material is not introduced into the conventional semiconductor fabrication processes (e.g., CMOS processes) and fabricated superconducting components are not damaged or destroyed by the conventional semiconductor fabrication processes.

The above deficiencies and other problems associated with conventional fabrication processes are reduced or eliminated by the disclosed methods and devices. In accordance with some embodiments, a device includes a first semiconductor oxide layer, a portion of a semiconductor layer disposed on the first semiconductor oxide layer, and a second semiconductor oxide layer including a first region disposed on the portion of the semiconductor layer and a second region disposed on the first semiconductor oxide layer. A thickness of the first region of the second semiconductor oxide layer is less than a predefined thickness. The device also includes an etch stop layer disposed on the second semiconductor oxide layer, and a plurality of distinct portions of a third semiconductor oxide layer disposed on the etch stop layer and exposing one or more distinct portions of the etch stop layer over the semiconductor portion. In some embodiments, the one or more distinct exposed portions of the etch stop layer include two or more exposed portions of the etch stop layer. The device further includes a plurality of distinct portions of a superconducting layer disposed on the plurality of distinct portions of the third semiconductor oxide layer and the exposed one or more distinct portions of the etch stop layer.

In accordance with some embodiments, a method includes obtaining a first device. The first device includes: a first semiconductor oxide layer, a portion of a semiconductor layer disposed on the first semiconductor oxide layer, and a second semiconductor oxide layer including a first region disposed on the portion of the semiconductor layer and a second region disposed on the first semiconductor oxide layer. A thickness of the first region of the second semiconductor oxide layer is less than a first predefined thickness. The first device also includes: an etch stop layer disposed on the second semiconductor oxide layer, and a third semiconductor oxide layer disposed on the etch stop layer. A thickness of the third semiconductor oxide layer is at least a second predefined thickness.

In accordance with some embodiments, a method includes obtaining a device. The device includes: a first semiconductor oxide layer, a portion of a semiconductor layer disposed on the first semiconductor oxide layer, and a second semiconductor oxide layer including a first region disposed on the portion of the semiconductor layer and a second region disposed on the first semiconductor oxide layer. A thickness of the first region of the second semiconductor oxide layer is less than a first predefined thickness. The device also includes: an etch stop layer disposed on the second semiconductor oxide layer; and a plurality of distinct portions of a third semiconductor oxide layer disposed on the etch stop layer and exposing one or more distinct portions of the etch stop layer. A thickness of the third semiconductor oxide layer is at least a second predefined thickness. The method also includes depositing a superconducting layer on the third semiconductor oxide layer to form a plurality of distinct portions of the superconducting layer disposed respectively on the plurality of distinct portions of the third semiconductor oxide layer and on the one or more distinct exposed portions of the etch stop layer.

In accordance with some embodiments, a device includes a first semiconductor oxide layer, a portion of a semiconductor layer disposed on the first semiconductor oxide layer, and a second semiconductor oxide layer including a first region disposed on the portion of the semiconductor layer and a second region disposed on the first semiconductor oxide layer. A thickness of the first region of the second semiconductor oxide layer is less than a predefined thickness. The device also includes one or more distinct regions of a superconducting layer disposed on the second semiconductor oxide layer over the portion of the semiconductor layer.

In accordance with some embodiments, a method includes obtaining a device with a first semiconductor oxide layer, depositing a semiconductor layer on the first semiconductor oxide layer, and removing one or more portions of the semiconductor layer to define a portion of the semiconductor layer and to expose one or more portions of the first semiconductor oxide layer. The method also includes, after removing the one or more portions of the semiconductor layer, depositing a second semiconductor oxide layer, the second semiconductor oxide layer including a first region disposed on the portion of the semiconductor layer and a second region disposed on the one or more exposed portions of the first semiconductor oxide layer. A thickness of the first region of the second semiconductor oxide layer is less than a predefined thickness. After depositing the second semiconductor oxide layer, the device is configured to receive, on the second semiconductor oxide layer, deposition of a superconducting layer for providing one or more distinct portions of the superconducting layer.

In accordance with some embodiments, a method includes obtaining a device with: a first semiconductor oxide layer, a portion of a semiconductor layer disposed on the first semiconductor oxide layer, and a second semiconductor oxide layer including a first region disposed on the portion of the semiconductor layer and a second region disposed on the first semiconductor oxide layer. A thickness of the first region of the second semiconductor oxide layer is less than a predefined thickness. The method also includes depositing a superconducting layer on the device, and removing one or more portions of the superconducting layer to define one or more distinct portions of the superconducting layer to produce a superconducting nanowire single-photon detector.

In accordance with some embodiments, a device includes a first semiconductor layer; a portion of a second semiconductor layer disposed on the first semiconductor layer; and a third semiconductor layer including a first region disposed on the portion of the second semiconductor layer and a second region disposed on the first semiconductor layer. A thickness of the first region of the third semiconductor layer is less than a predefined thickness. The device also includes an etch stop layer disposed on the third semiconductor layer; a plurality of distinct portions of a fourth semiconductor layer disposed on the etch stop layer and exposing one or more distinct portions of the etch stop layer over the portion of the second semiconductor layer; and a plurality of distinct portions of a superconducting layer disposed on the plurality of distinct portions of the fourth semiconductor layer and the exposed one or more distinct portions of the etch stop layer. It should be noted that the details of other embodiments described herein are also applicable in an analogous manner to these embodiments. For brevity, these details are not repeated here.

In accordance with some embodiments, a method includes obtaining a first device with a first semiconductor layer; a portion of a second semiconductor layer disposed on the first semiconductor layer; and a third semiconductor layer including a first region disposed on the portion of the second semiconductor layer and a second region disposed on the first semiconductor layer. A thickness of the first region of the third semiconductor layer is less than a first predefined thickness. The first device also includes an etch stop layer disposed on the third semiconductor layer; and a fourth semiconductor layer disposed on the etch stop layer. A thickness of the fourth semiconductor layer is at least a second predefined thickness. It should be noted that the details of other embodiments described herein are also applicable in an analogous manner to these embodiments. For brevity, these details are not repeated here.

In accordance with some embodiments, a method includes obtaining a device with a first semiconductor layer; a portion of a second semiconductor layer disposed on the first semiconductor layer; and a third semiconductor layer including a first region disposed on the portion of the second semiconductor layer and a second region disposed on the first semiconductor layer. A thickness of the first region of the third semiconductor layer is less than a first predefined thickness. The device also includes an etch stop layer disposed on the third semiconductor layer; and a plurality of distinct portions of a fourth semiconductor layer disposed on the etch stop layer and exposing one or more distinct portions of the etch stop layer. A thickness of the fourth semiconductor layer is at least a second predefined thickness. The method also includes depositing a superconducting layer on the fourth semiconductor layer to form a plurality of distinct portions of the superconducting layer disposed respectively on the plurality of distinct portions of the fourth semiconductor layer and on the one or more distinct exposed portions of the etch stop layer. It should be noted that the details of other embodiments described herein are also applicable in an analogous manner to these embodiments. For brevity, these details are not repeated here.

In accordance with some embodiments, a device includes a first semiconductor layer; a portion of a second semiconductor layer disposed on the first semiconductor layer; and a third semiconductor layer including a first region disposed on the portion of the second semiconductor layer and a second region disposed on the first semiconductor layer. A thickness of the first region of the third semiconductor layer is less than a predefined thickness. The device also includes one or more distinct regions of a superconducting layer disposed on the third semiconductor layer over the portion of the second semiconductor layer. It should be noted that the details of other embodiments described herein are also applicable in an analogous manner to these embodiments. For brevity, these details are not repeated here.

In accordance with some embodiments, a method includes obtaining a device with a first semiconductor layer; depositing a second semiconductor layer on the first semiconductor layer; and removing one or more portions of the second semiconductor layer to define a portion of the second semiconductor layer and to expose one or more portions of the first semiconductor layer. The method also includes, after removing the one or more portions of the second semiconductor layer, depositing a third semiconductor layer, the third semiconductor layer including a first region disposed on the portion of the second semiconductor layer and a second region disposed on the one or more exposed portions of the first semiconductor layer. A thickness of the first region of the third semiconductor layer is less than a predefined thickness. The device is configured to receive, on the third semiconductor layer, deposition of a superconducting layer for providing one or more distinct portions of the superconducting layer. It should be noted that the details of other embodiments described herein are also applicable in an analogous manner to these embodiments. For brevity, these details are not repeated here.

In accordance with some embodiments, a method includes obtaining a device with a first semiconductor layer; a portion of a second semiconductor layer disposed on the first semiconductor layer; and a third semiconductor layer including a first region disposed on the portion of the second semiconductor layer and a second region disposed on the first semiconductor layer. A thickness of the first region of the third semiconductor layer is less than a predefined thickness. The method also includes depositing a superconducting layer on the device; and removing one or more portions of the superconducting layer to define one or more distinct portions of the superconducting layer to produce a superconducting nanowire single-photon detector. It should be noted that the details of other embodiments described herein are also applicable in an analogous manner to these embodiments. For brevity, these details are not repeated here.

BRIEF DESCRIPTION OF THE DRAWINGS

For a better understanding of the various described embodiments, reference should be made to the Detailed Description below, in conjunction with the following drawings.

FIGS. 4A-4C are flow diagrams illustrating a method of forming a superconducting nanowire single-photon detector in accordance with some embodiments.

FIGS. 4D-4F are flow diagrams illustrating a method of forming a superconducting nanowire single-photon detector in accordance with some embodiments.

FIG. 5B is a flow diagram illustrating a method of forming a superconducting nanowire single-photon detector in accordance with some embodiments.

Figure 1A:
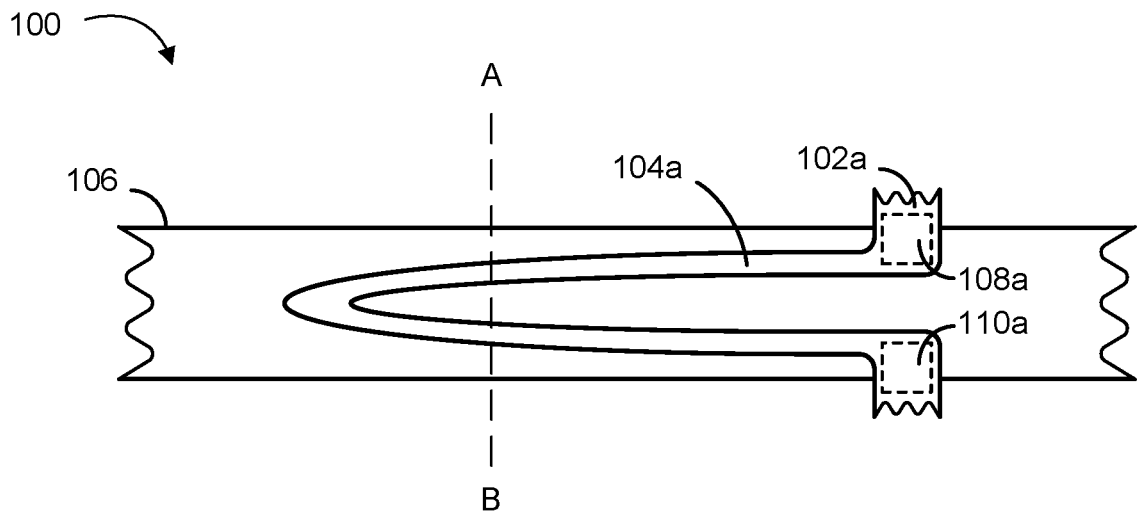
FIGS. 1A-1C are plan view diagrams illustrating example configurations of single-photon detectors.

In accordance with common practice the various features illustrated in the drawings may not be drawn to scale. Accordingly, the dimensions of the various features may be arbitrarily expanded or reduced for clarity. In addition, some of the drawings may not depict all the components of a given system, method or device, or may depict relevant features or portions of a component without depicting the full extent of the component. Finally, like reference numerals refer to corresponding parts throughout the several views of the drawings.

DETAILED DESCRIPTION

Reference will now be made in detail to embodiments, examples of which are illustrated in the accompanying drawings. In the following detailed description, numerous specific details are set forth to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

It will also be understood that, although the terms "first," "second," etc. may be used herein to describe various elements, these elements should not be limited by these terms. These terms are only used to distinguish one element from another. For example, a first layer could be termed a second layer, and, similarly, a second layer could be termed a first layer, without changing the meaning of the description, so long as all occurrences of the "first layer" are renamed consistently and all occurrences of the second layer are renamed consistently. The first layer and the second layer are both layers, but they are not the same layer, unless the context clearly indicates otherwise.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the phrase "at least one of A, B and C" is to be construed to require one or more of the listed items, and this phase reads on a single instance of A alone, a single instance of B alone, or a single instance of C alone, while also encompassing combinations of the listed items such as "one or more of A and one or more of B without any of C," and the like.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

Figure 1B:
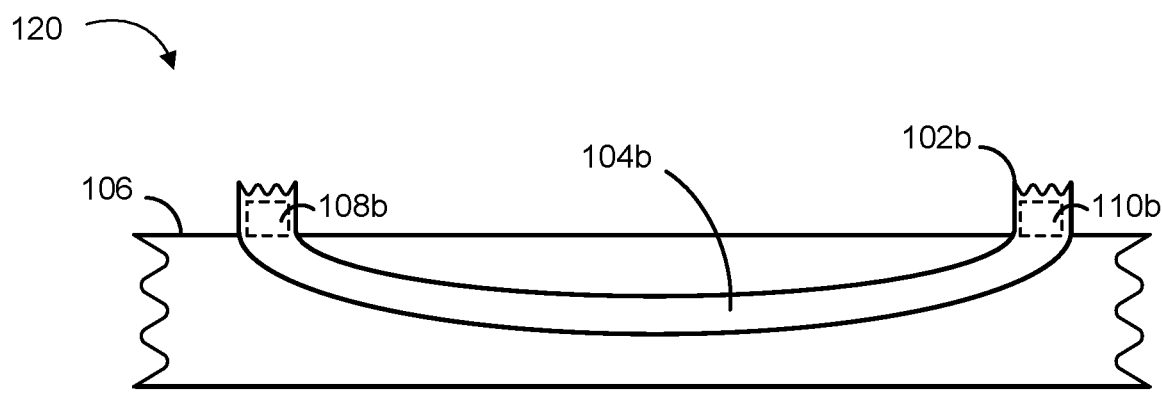
Figure 1C:
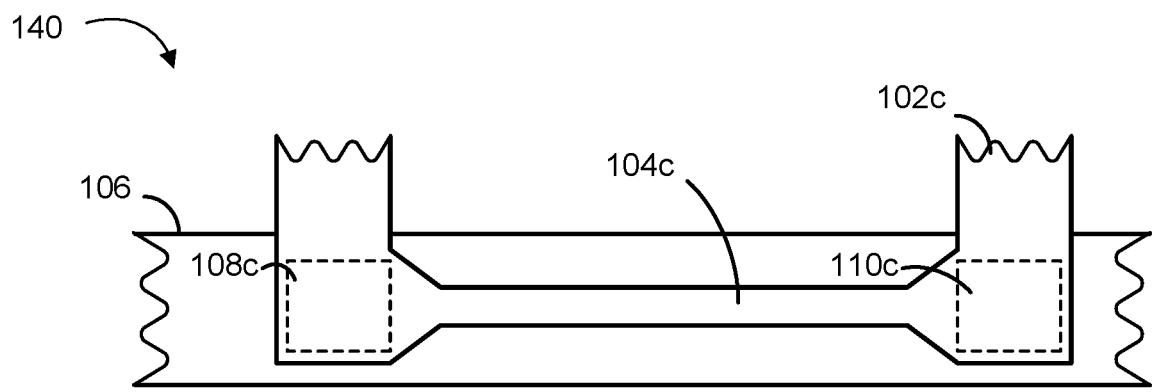

FIGS. 1A-1C are plan view diagrams illustrating example configurations of superconducting nanowire single-photon detector structures, in accordance with some embodiments. In particular, FIGS. 1A-1C illustrate example configurations of waveguide-coupled superconducting nanowire single-photon detectors (sometimes called herein "SNSPDs," "single-photon detectors," or "detectors," for brevity), as explained in further detail herein. So as not to obscure the drawings, FIGS. 1A-1C show only the waveguide portion and detector portion of the structures, and omit any underlying, intervening, or superimposed layers.

FIG. 1A illustrates example device 100. Device 100 includes detector 102a having a detection zone 104a (e.g., a superconducting nanowire) situated above waveguide 106. In the absence of a photon in waveguide 106 below detection zone 104a, detection zone 104a has a first resistance. The resistance of detection zone 104a can be monitored using electronic measurement equipment (e.g., by placing measurement probes on measurement regions 108a and 110a) or a readout circuit. A photon passing through waveguide 106 is absorbed by detection zone 104a, thereby causing a change in the resistance of detection zone 104a from the first resistance to a second resistance greater than the first resistance. The change in resistance of detection zone 104a can be registered on the electronic measurement equipment or a readout circuit, thereby detecting the photon. For example, the structures shown in FIG. 1A with detection zone 104a formed using superconducting material (e.g., a material that exhibits zero resistance when cooled to a temperature below its critical temperature) are cooled to a temperature below the critical temperature of the superconducting material. In these conditions, in the absence of a photon in waveguide 106, the resistance of detection zone 104a is zero. When a photon passes through waveguide 106, the resistance of detection zone increases significantly to a non-zero resistance (typically larger than 50 ohms) due to the formation of a non-superconducting region in a region of detection zone 104a corresponding to the location of the photon in waveguide 106.

FIG. 1B illustrates another example device 120. In device 120, detection zone 104b of detector 102b is situated above waveguide 106 but has a different configuration from that of detection zone 104a and detector 102a shown in FIG. 1A. The resistance of detection zone 104b is monitored using measurement regions 108b and 110b.

FIG. 1C illustrates yet another example device 140. In device 140, detection zone 104c of detector 102c is situated above waveguide 106 but has a different configuration from those of detector 102a and detection zone 104a, and of detector 102b and detection zone 104b. Detector 102c includes expanded measurement regions 108c and 110c. Measurement regions 108c and 110c are larger than those shown in FIGS. 1A and 1B, to reduce formation of a non-superconducting region in the measurement regions 108c and 110c.

FIGS. 2A-2I are cross-sectional diagrams illustrating an example method of forming a superconducting nanowire single-photon detector, in accordance with some embodiments. In particular, FIGS. 2A-2I illustrate a first method of forming device 100-1, which corresponds to device 100 shown in FIG. 1A. Line AB in FIG. 1A indicates the plane on which sectional views shown in FIGS. 2A-2I are taken throughout the process of forming device 100-1.

Figure 2A:
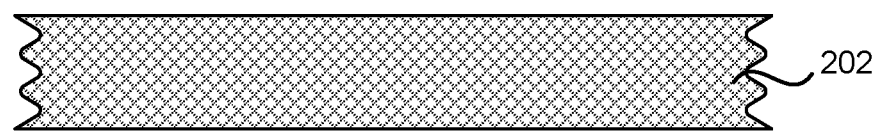
FIGS. 2A-2I are cross-sectional diagrams illustrating an example method of forming a superconducting nanowire single-photon detector.

FIG. 2A shows substrate 202. In some embodiments, substrate 202 is a semiconductor substrate, such as a silicon substrate.

Figure 2B:
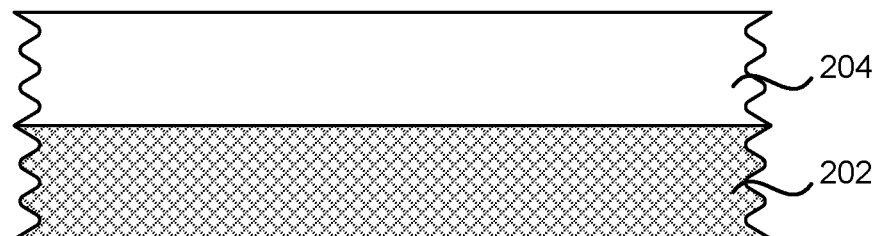

FIG. 2B shows the addition (e.g., deposition) of layer 204 on substrate 202. In some embodiments, layer 204 is a semiconductor layer. In some embodiments, layer 204 is a layer of semiconductor oxide material, such as silicon dioxide. In some embodiments, layer 204 is disposed directly onto substrate 202. In some embodiments, layer 204 is disposed over substrate 202 with one or more intervening layers. In some embodiments, device 100-1 includes at least an intervening semiconductor (e.g., silicon) layer between substrate 202 and layer 204 (e.g., if substrate 202 is not a semiconductor substrate).

Figure 2C:
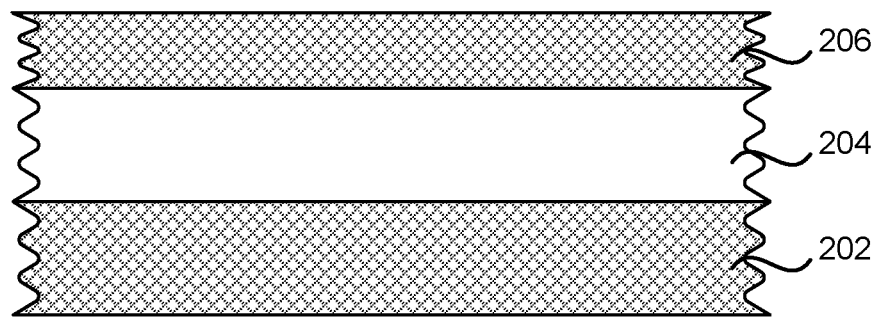
Figure 2D:
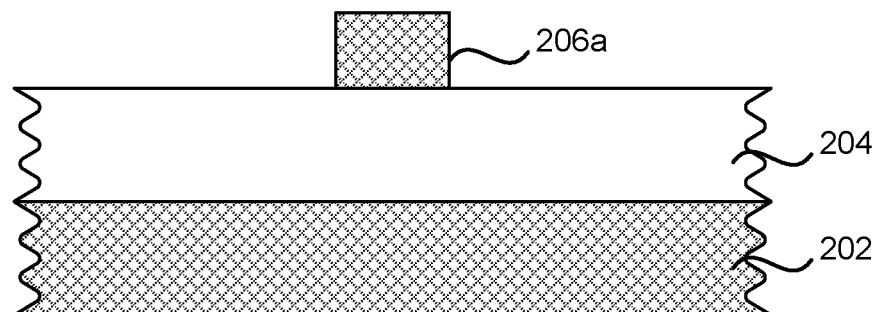

FIGS. 2C-2D illustrate the addition (e.g., deposition and, optionally, subsequent patterning or etching) of portion 206a on layer 204. In particular, FIG. 2C shows the addition of layer 206 on layer 204. In some embodiments, layer 206 is a layer of semiconductor material, such as silicon. In FIG. 2D, layer 206 has been patterned (e.g., one or more portions of layer 206 have been removed) to form a distinct remaining portion 206a of layer 206 and to expose one or more portions of layer 204. In some embodiments, a thickness of layer 206, and similarly of portion 206a, is a predefined thickness (e.g., 200 nm), or within a predefined tolerance of the predefined thickness (e.g., within 5-10% of 200 nm).

In some embodiments, portion 206a is configured to operate as a waveguide. In some embodiments, the materials for layer 204, portion 206a, and layer 208 (described herein with respect to FIG. 2E) are selected so as to enable portion 206a to operate as a waveguide. For example, a first material (e.g., having a high index of refraction) is selected for portion 206a, and a second material (e.g., having a low index of refraction) is selected for layer 204 and layer 208, such that a photon traveling in portion 206a experiences total internal reflection (e.g., due to the index of refraction of portion 206a being sufficiently higher than that of the surrounding layers 204 and 208). In accordance with these principles, one of ordinary skill in the art will recognize that many different combinations of materials may be used. In one example implementation, layer 204, portion 206a, and layer 208 are made of one or more semiconductor materials having the properties described above. For example, layer 204 and layer 208 are layers of semiconductor oxide material (e.g., silicon dioxide), and portion 206a is made of a semiconductor material (e.g., silicon).

Figure 2E:
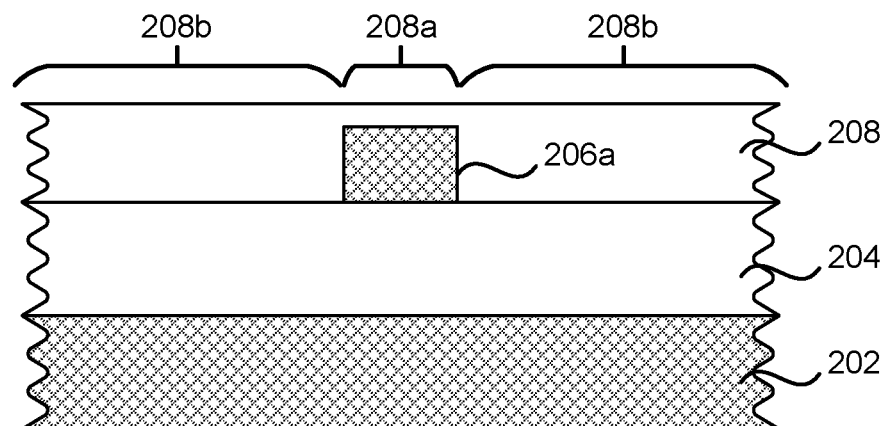

FIG. 2E shows the addition (e.g., deposition) of layer 208 after patterning layer 206 to form portion 206a. Layer 208 is disposed over portion 206a and over layer 204 (e.g., covering or encapsulating the waveguide). In some embodiments, layer 208 is a semiconductor layer. In some embodiments, layer 208 is a layer of semiconductor oxide material, such as silicon dioxide. In some embodiments, layer 208 is made of the same material as layer 204. Layer 208 includes first region 208a disposed on portion 206a, and second region 208b disposed on layer 204 (e.g., on the one or more portions of layer 204 that were exposed by patterning layer 206 to remove one or more corresponding portions of layer 206). In some embodiments, a thickness of first region 208a is less than a predefined thickness. In some embodiments, first region 208a must be sufficiently thin so as not to decouple portion 206a from any superconducting nanowires disposed over first region 208a (such as one or more nanowires formed by superconducting layers 214 and 316, described herein with reference to FIGS. 2I and 3F-3G). If first region 208a is too thick, the superimposed nanowires will not be able to reliably detect photons in the waveguide. In some embodiments, the thickness of first region 208a is selected so that a detection efficiency of a superimposed nanowire (e.g., a measure, such as a ratio, of the number of times the nanowire detects a photon passing through the waveguide relative to the total number of times that a photon passed through the waveguide) is above a predefined reliability threshold. In one example implementation, first region 208a is less than (or at most) 100 nm in thickness.

In some embodiments, layer 208 has, or is processed to have, a substantially flat surface. In some embodiments, layer 208 is deposited on portion 206a and layer 204 so as to form a substantially flat surface. In some embodiments, after layer 208 is deposited on portion 206a and layer 204, the surface of layer 208 is smoothed. For example, the surface of layer 208 may be smoothed using chemical-mechanical-planarization (CMP), or one or more other smoothing processes. In some embodiments, the surface roughness (e.g., the variation in surface depth) of layer 208 is within a predefined variance (e.g., within 1 nm). In some embodiments, the surface roughness of layer 208 is between 0.1 nm and 1 nm. In some embodiments, the thickness of second region 208b (e.g., after smoothing) is, or corresponds to, the sum of the thickness of portion 206a (e.g., the height of the waveguide) and the thickness of first region 208a (e.g., the thinner region of layer 208).

Figure 2F:
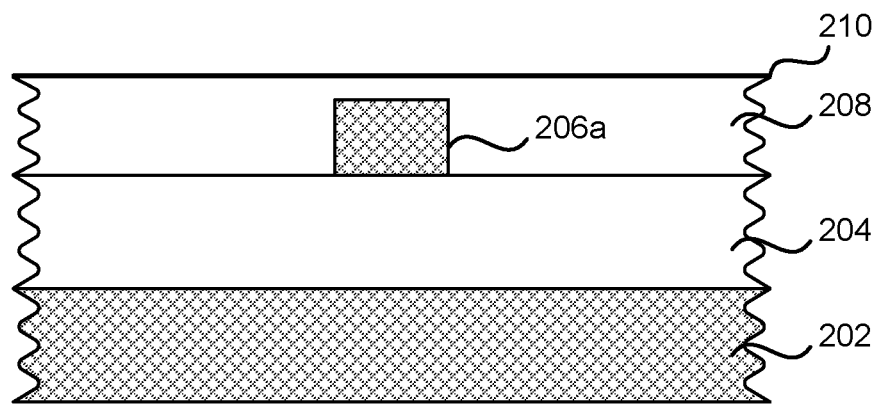

FIG. 2F shows the addition (e.g., deposition) of etch stop layer 210. In some embodiments, etch stop layer 210 acts as a barrier during etching (e.g., removal) of layers disposed on top of etch stop layer 210, such that layers above etch stop layer 210 can be etched, while layers underneath etch stop layer 210 are protected from being etched (e.g., as described herein with reference to layer 212, FIGS. 2G-2H). In some embodiments, etch stop layer 210 is made of silicon nitride, silicon, or aluminum nitride. In some embodiments, etch stop layer 210 need only be a few nanometers thick to serve as an effective barrier to etching. In some embodiments, a thickness of etch stop layer 210 is between 5 nm and 10 nm (e.g., at least 5 nm and at most 10 nm). In some embodiments, the combined thickness of etch stop layer 210 and first region 208a of layer 208 must be sufficiently thin so as not to decouple waveguide portion 206a from any superconducting nanowires disposed over first region 208a (such as one or more nanowires formed by superconducting layer 214, described herein with reference to FIG. 2I).

Figure 2G:
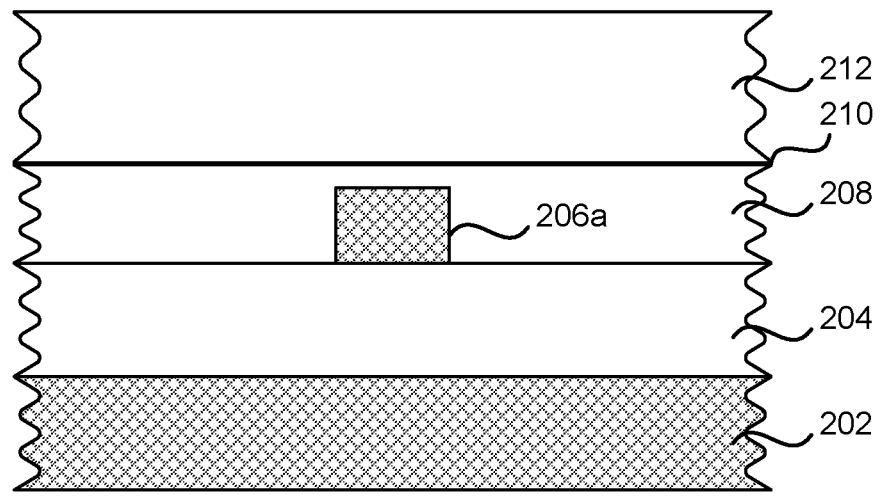
Figure 2H:
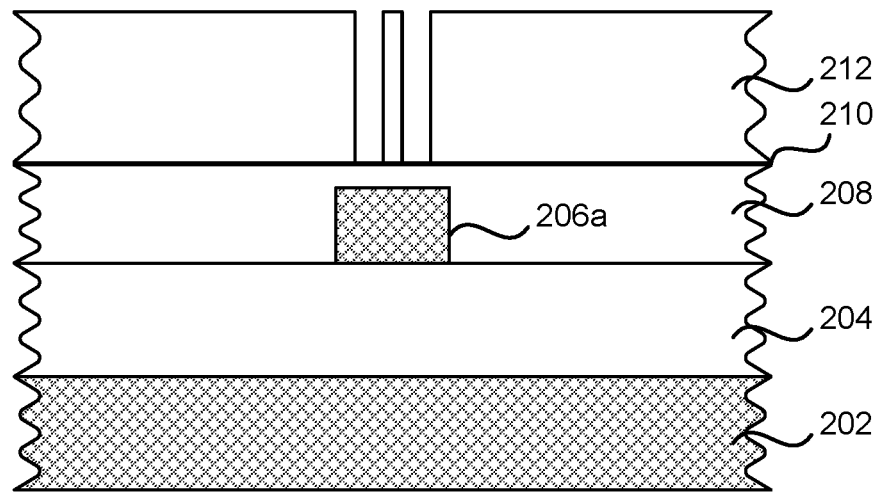

FIGS. 2G-2H show the formation of high aspect ratio trenches by the addition and patterning of layer 212. In particular, FIG. 2G shows the addition (e.g., deposition) of layer 212 on etch stop layer 210 (e.g., covering at least a portion of the waveguide). In FIG. 2H, layer 212 has been patterned so as to remove (e.g., etch) portions of layer 212. In some embodiments, the patterning etches one or more portions of layer 212 as far down as etch stop layer 210, thereby exposing one or more corresponding portions of etch stop layer 210 that were underneath the one or more etched portions of layer 212. In some embodiments, etch stop layer 210 prevents further etching beyond etch stop layer 210, so that layer 208 and all underlying layers remain unexposed and un-etched. In some embodiments, the one or more exposed portions of etch stop layer 210 are located above portion 206a (and a waveguide formed by portion 206a). In some embodiments, the patterning leaves un-etched one or more remaining portions of layer 212. In some embodiments, the thickness of layer 212 has at least a second predefined thickness (e.g., at least 500 nm in thickness). In some embodiments, the thickness of layer 212 is large enough such that the etching of layer 212 forms deep trenches from the top surface of layer 212 down to etch stop layer 210. In some embodiments, the width of a respective exposed portion of etch stop layer 210 (e.g., the width of a respective trench) defines the width of a respective subsequently formed nanowire (e.g., as described herein with reference to superconducting layer 214, FIG. 2I). In some embodiments, the width of a respective exposed portion of etch stop layer 210 is a predefined width (e.g., 100 nm), or within a predefined tolerance of the predefined width (e.g., within 5-10% of 100 nm). In some embodiments, the thickness of layer 212 is at least a predefined multiple of the predefined width of a respective exposed portion of etch stop layer (e.g., at least five times). In one example implementation, a width of a respective trench is 100 nm, and the depth of the respective trench is at least 500 nm.

Figure 2I:
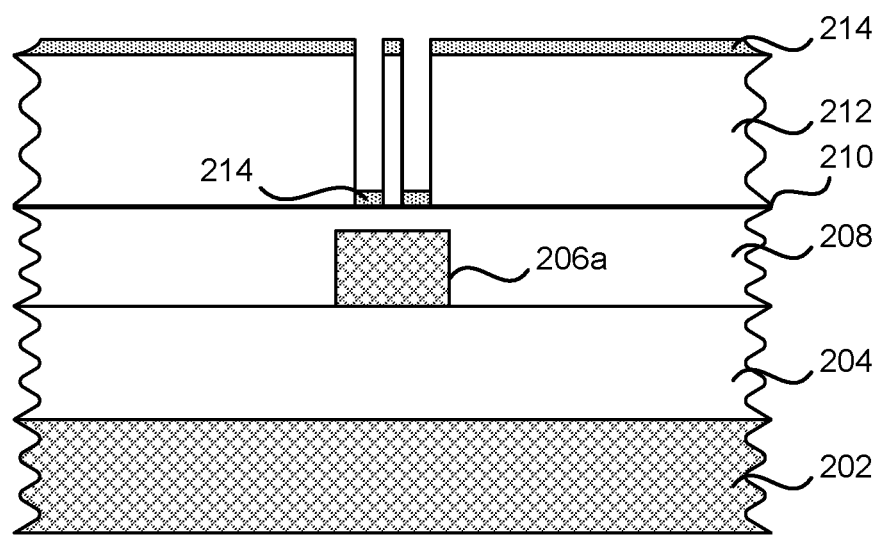

FIG. 2I shows the addition of superconducting layer 214. In some embodiments, superconducting layer 214 is a layer of superconducting material, such as niobium nitride, niobium-germanium, or molybdenum silicide. In some embodiments, superconducting layer 214 is deposited on the one or more remaining portions of layer 212 and the one or more exposed portions of etch stop layer 210. In some embodiments, depositing superconducting layer 214 on device 100-1 as shown in FIG. 2H results in the formation of distinct portions of superconducting layer 214 (e.g., discontinuous layers). For example, as shown in FIG. 2I, when superconducting layer 214 is deposited, the superconducting material is added to the top surfaces of the one or more remaining portions of layer 212, and to the one or more exposed portions of etch stop layer 210, but not to the side walls of the trenches. In some embodiments, the one or more portions of superconducting layer 214 that are disposed on the one or more exposed portions of etch stop layer 210 (e.g., so as to overlay waveguide portion 206a) form one or more superconducting nanowires of one or more single-photon detectors. For example, the one or more portions of superconducting layer 214 that are disposed on the one or more exposed portions of etch stop layer 210 correspond to detection zone 104a of detector 102a shown in FIG. 1A, and waveguide portion 206a corresponds to waveguide 106, FIGS. 1A-1C. In some embodiments, a width of a respective portion of superconducting layer 214 that is disposed on etch stop layer 210 (e.g., a respective nanowire) is defined by the width of the associated trench. In some embodiments, a thickness of a respective portion of superconducting layer 214 (e.g., a respective nanowire disposed on the etch stop layer) is a third predefined thickness (e.g., 5 nm), or within a predefined tolerance of the third predefined thickness (e.g., within 5-10% of 5 nm). In one example implementation, the width of a respective nanowire is 100 nm, and the thickness of the respective nanowire is 5 nm.

In some embodiments, after deposition of superconducting layer 214 as shown in FIG. 2I is performed, device 100-1 is complete, and no subsequent processing steps are performed, thereby avoiding any damage to the superconducting structures that would have occurred with further processing. In some embodiments, the method includes forgoing any subsequent processing steps or processing operations, other than addition (e.g., deposition) of a protective layer, after depositing the superconducting layer.

FIGS. 3A-3G are cross-sectional diagrams illustrating an example method of forming a superconducting nanowire single-photon detector, in accordance with some embodiments. In particular, FIGS. 3A-3G illustrate a second method of forming device 100-1, which corresponds to device 100 shown in FIG. 1A. Line AB in FIG. 1A indicates the plane on which sectional views shown in FIGS. 3A-3G are taken throughout the process of forming device 100-2.

FIGS. 3A-3E are similar to FIGS. 2A-2E, as described above. FIGS. 3A-3E illustrate the formation of a structure having substrate 202, layer 204, portion 206a, and layer 208 (having first region 208a and second region 208b), where layer 204 and layer 208 encapsulate portion 206a (e.g., forming a waveguide), and where first region 208a of layer 208 is sufficiently thin so as not to decouple portion 206 from any superconducting nanowires disposed over first region 208a (such as one or more nanowires formed by superconducting layer 316, described herein with reference to FIGS. 3F-3G).

Figure 3A:
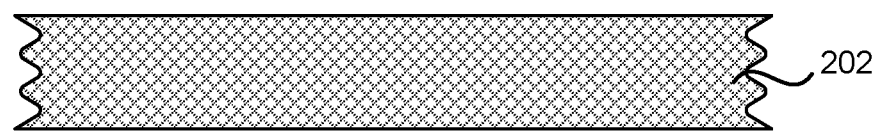
FIGS. 3A-3G are cross-sectional diagrams illustrating an example method of forming a superconducting nanowire single-photon detector.
Figure 3B:
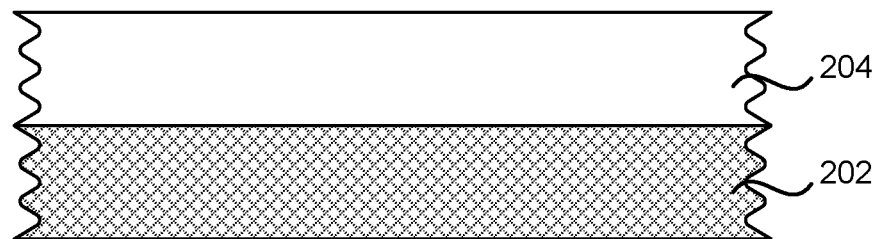
Figure 3C:
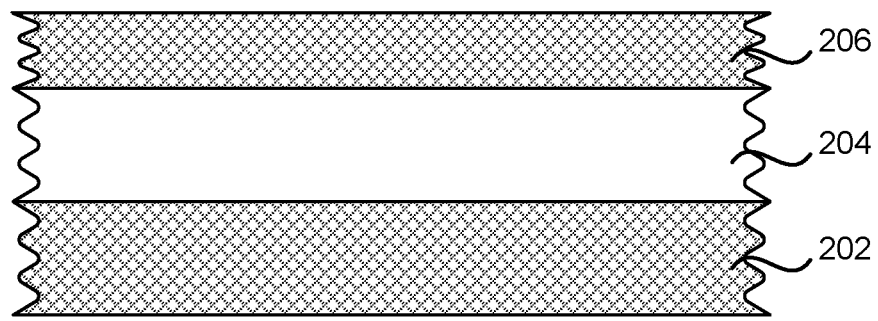
Figure 3D:
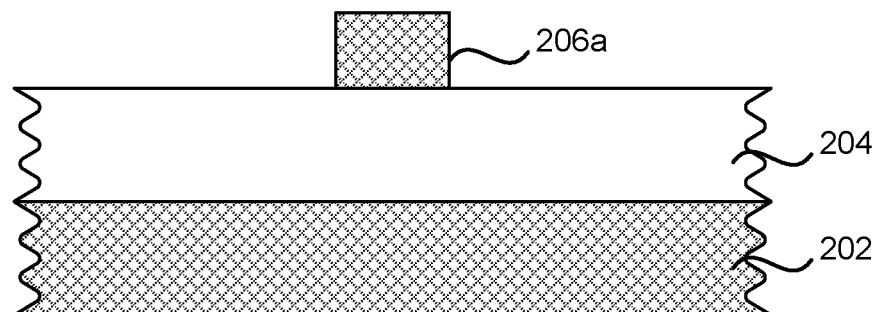
Figure 3E:
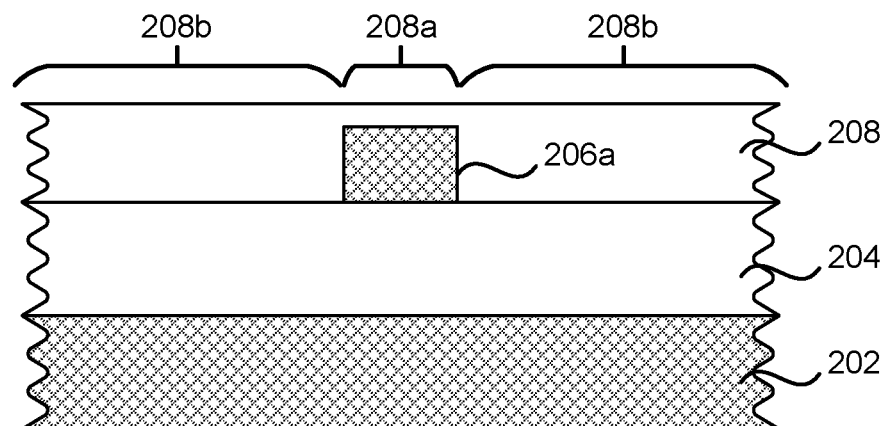
Figure 3F:
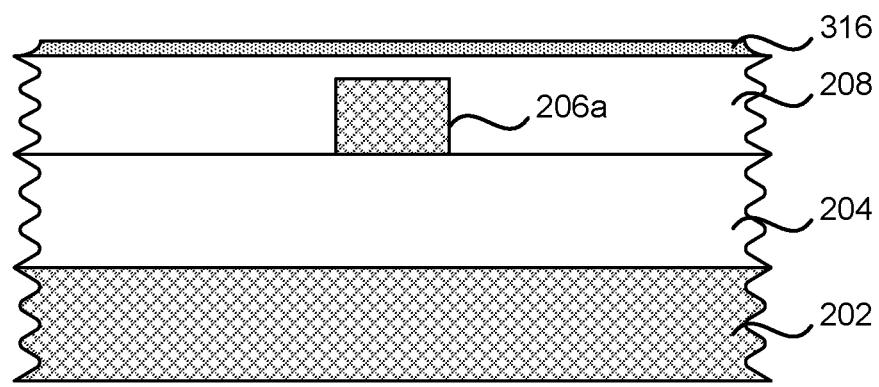
Figure 3G:
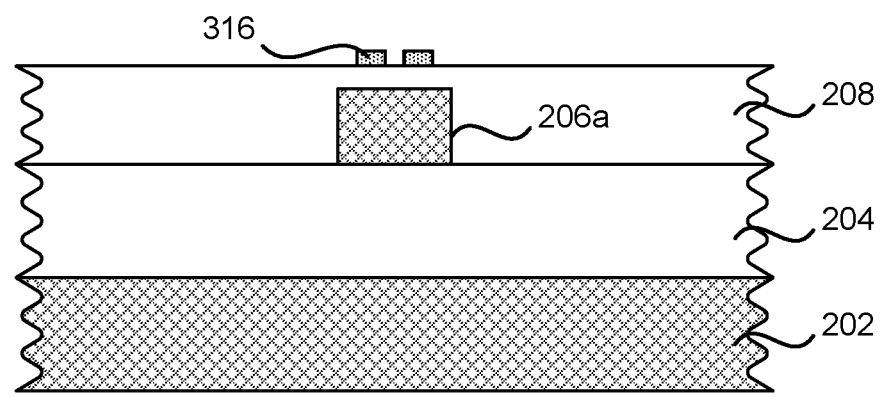

FIGS. 3F-3G illustrate the formation of one or more portions of superconducting layer 316. In particular, FIG. 3F shows the addition (e.g., deposition) of superconducting layer 316 on layer 208. In some embodiments, superconducting layer 316 is a layer of superconducting material, such as niobium nitride, niobium-germanium, or molybdenum silicide. In FIG. 3G, superconducting layer 316 has been patterned (e.g., one or more portions of superconducting layer 316 have been removed) to form one or more distinct remaining portions of superconducting layer 316 and to expose one or more portions of layer 208. In some embodiments, the one or more remaining portions of superconducting layer 316 overlap portion 206a (e.g., the waveguide) and form one or more superconducting nanowires of one or more single-photon detectors. For example, the one or more remaining portions of superconducting layer 316 correspond to detection zone 104a of detector 102a, FIG. 1A, and waveguide portion 206a corresponds to waveguide 106, FIG. 1A. In some embodiments, a width of a respective portion of superconducting layer 316 (e.g., a respective nanowire) is a predefined width (e.g., 100 nm), or within a predefined tolerance of the predefined width (e.g., within 5-10% of 100 nm). In some embodiments, a thickness of a respective portion of the superconducting layer is a predefined thickness (e.g., 5 nm), or within a predefined tolerance of the predefined thickness (e.g., within 5-10% of 5 nm).

In some embodiments, after deposition and patterning of superconducting layer 316 as shown in FIG. 3G is performed, device 100-2 is complete. In some embodiments, no subsequent processing steps are performed, thereby avoiding any damage to the superconducting structures that would have occurred with further processing.

FIGS. 4A-4C are flow diagrams illustrating method 400A of forming a superconducting nanowire single-photon detector in accordance with some embodiments. In some embodiments, and as described herein, method 400A is performed by a fabrication facility (also called a foundry). In some embodiments, the device produced by method 400A is provided to a customer of the foundry for further processing. In some embodiments, the devices produced by and throughout method 400A correspond to the devices shown in and described herein with reference to FIGS. 2A-2I.

The method includes obtaining (402) a first device (e.g., device 100-1, FIG. 2G). The first device has a first semiconductor oxide layer (sometimes called a first oxide layer, for brevity) (e.g., layer 204, FIG. 2G), a portion of a semiconductor layer (e.g., a waveguide) (e.g., portion 206a, FIG. 2G) disposed on the first semiconductor oxide layer, and a second semiconductor oxide layer (sometimes called a second oxide layer, for brevity) (e.g., layer 208, FIG. 2G). The second semiconductor oxide layer includes a first region (e.g., first region 208a, FIG. 2E) disposed on the portion of the semiconductor layer and a second region (e.g., second region 208b, FIG. 2E) disposed on the first semiconductor oxide layer. A thickness of the first region of the second semiconductor oxide layer is less than a first predefined thickness (e.g., 100 nm). The first device also includes an etch stop layer (e.g., etch stop layer 210, FIG. 2G) disposed on the second semiconductor oxide layer, and a third semiconductor oxide layer (sometimes called a third oxide layer, for brevity) (e.g., layer 212, FIG. 2G) disposed on the etch stop layer. A thickness of the third semiconductor oxide layer is at least a second predefined thickness (e.g., at least 500 nm in thickness).

In some embodiments, the first device is configured (404) such that (1) removing one or more portions of the third semiconductor oxide layer to define a plurality of distinct portions of the third semiconductor oxide layer and to expose one or more distinct portions of the etch stop layer (e.g., as shown in and described herein with reference to FIG. 2H), and (2) depositing, on the plurality of distinct portions of the third semiconductor oxide layer and the one or more distinct exposed portions of the etch stop layer, a superconducting layer (e.g., superconducting layer 214, FIG. 2I), forms a plurality of distinct portions of the superconducting layer disposed respectively on the plurality of distinct portions of the third semiconductor oxide layer and on the one or more distinct exposed portions of the etch stop layer (e.g., to produce a superconducting nanowire single-photon detector) (e.g., as described herein with reference to FIG. 2I). In some embodiments, the thickness of the second oxide layer is large enough such that the plurality of distinct portions of the second oxide layer form trenches from the top surface of the second oxide layer down to the etch stop layer. In some embodiments, a width of a respective exposed portion of the etch stop layer (e.g., a width of a respective trench) is 100 nm. In some embodiments, the thickness of the third oxide layer (e.g., the second predefined thickness) is at least a predefined multiple of the width of a respective exposed portion of the etch stop layer. In some embodiments, when the superconducting layer is disposed (e.g., deposited) over the portions of the second oxide layer and the one or more exposed portions of the etch stop layer, the superconducting layer forms distinct portions (e.g., a discontinuous layer). For example, when the superconducting layer is deposited, superconducting material is added to the top surfaces of the distinct portions of the second oxide layer, and to the one or more exposed portions of the etch stop layer (e.g., forming the superconducting nanowires of the single-photon detector), but not to the side walls of the trenches (e.g., as shown in and described herein with reference to FIG. 2I).

In some embodiments, the etch stop layer and the third semiconductor oxide layer are configured (406) so that one or more portions of the third semiconductor oxide layer (e.g., overlapping the waveguide) are removable (e.g., to expose one or more corresponding portions of the etch stop layer) without exposing corresponding portions of the second semiconductor oxide layer (e.g., corresponding to the one or more portions of the third oxide layer being removed) (e.g., as shown in and described herein with reference to FIG. 2H).

In some embodiments, obtaining the first device includes (408): obtaining a second device (e.g., device 100-1 as shown in FIG. 2E) with the first semiconductor oxide layer, the portion of the semiconductor layer, and the second semiconductor oxide layer; depositing the etch stop layer on the second semiconductor oxide layer (e.g., as shown in and described herein with reference to FIG. 2F); and depositing the third semiconductor oxide layer on the etch stop layer (e.g., as shown in and described herein with reference to FIG. 2G).

In some embodiments, obtaining the second device includes (410): obtaining a third device with the first semiconductor oxide layer (e.g., device 100-1 as shown in FIG. 2B), depositing the semiconductor layer on the first semiconductor oxide layer (e.g., as described herein with reference to layer 206, FIG. 2C), and removing one or more portions of the semiconductor layer to define the portion of the semiconductor layer (e.g., a waveguide) and to expose the one or more portions of the first semiconductor oxide layer (e.g., corresponding portions of the first semiconductor oxide layer that were underneath the removed portions of the semiconductor layer) (e.g., as described herein with reference to portion 206a, FIG. 2D). In some embodiments, obtaining the second device also includes, after removing the one or more portions of the semiconductor layer, depositing the second semiconductor oxide layer (e.g., as described herein with reference to layer 208, FIG. 2E). In some embodiments, the second oxide layer has, or is processed to have, a substantially flat surface. In some embodiments, the second oxide layer is deposited on the first oxide layer and the semiconductor portion so as to form a substantially flat surface. In some embodiments, after the second oxide layer is deposited on the first oxide layer and the semiconductor portion, the surface of the second oxide layer is smoothed (e.g., using chemical-mechanical planarization (CMP) or one or more other smoothing processes). In some embodiments, obtaining the third device, depositing and removing the one or more portions of the semiconductor layer, and depositing the second oxide layer are performed prior to depositing the etch stop layer (e.g., the operations of step 410 are performed as part of the obtaining operation of step 408, and prior to performing the depositing operations of step 408).

In some embodiments, obtaining the second device includes (412), after depositing the second semiconductor oxide layer, processing the second semiconductor oxide layer to have a substantially flat surface (e.g., so that the surface roughness of the second oxide layer is within a predefined variance) (e.g., as described herein with reference to FIG. 2E).

In some embodiments, the third device includes (414) a substrate (e.g., substrate 202, FIG. 2B). In some embodiments, obtaining the third device includes depositing the first semiconductor oxide layer over the substrate (e.g., on top of the substrate or with intervening layers between the substrate and the first semiconductor oxide layer) (e.g., as shown in and described herein with reference to FIG. 2B). In some embodiments, the substrate is a semiconductor substrate, such as a silicon substrate. In some embodiments, the device includes at least an intervening semiconductor (e.g., silicon) layer between the substrate and the third oxide layer (e.g., if the substrate is not a semiconductor substrate). In some embodiments, depositing the first oxide layer over the substrate is performed prior to depositing the semiconductor layer on the first oxide layer (e.g., the operation of step 414 is performed as part of the obtaining operation of step 410, and prior to performing the depositing and removing operations of step 410).

In some embodiments, the predefined thickness is 100 nm (416).

In some embodiments, a width of a respective portion of the superconducting layer disposed on a corresponding exposed portion of the etch stop layer is 100 nm (418).

In some embodiments, a thickness of the third semiconductor oxide layer is at least 500 nm (420).

In some embodiments, the portion of the semiconductor layer is 200 nm in thickness (422).

In some embodiments, the portion of the semiconductor layer is a waveguide (424).

In some embodiments, the semiconductor layer is a silicon layer (426).

Figure 4D:
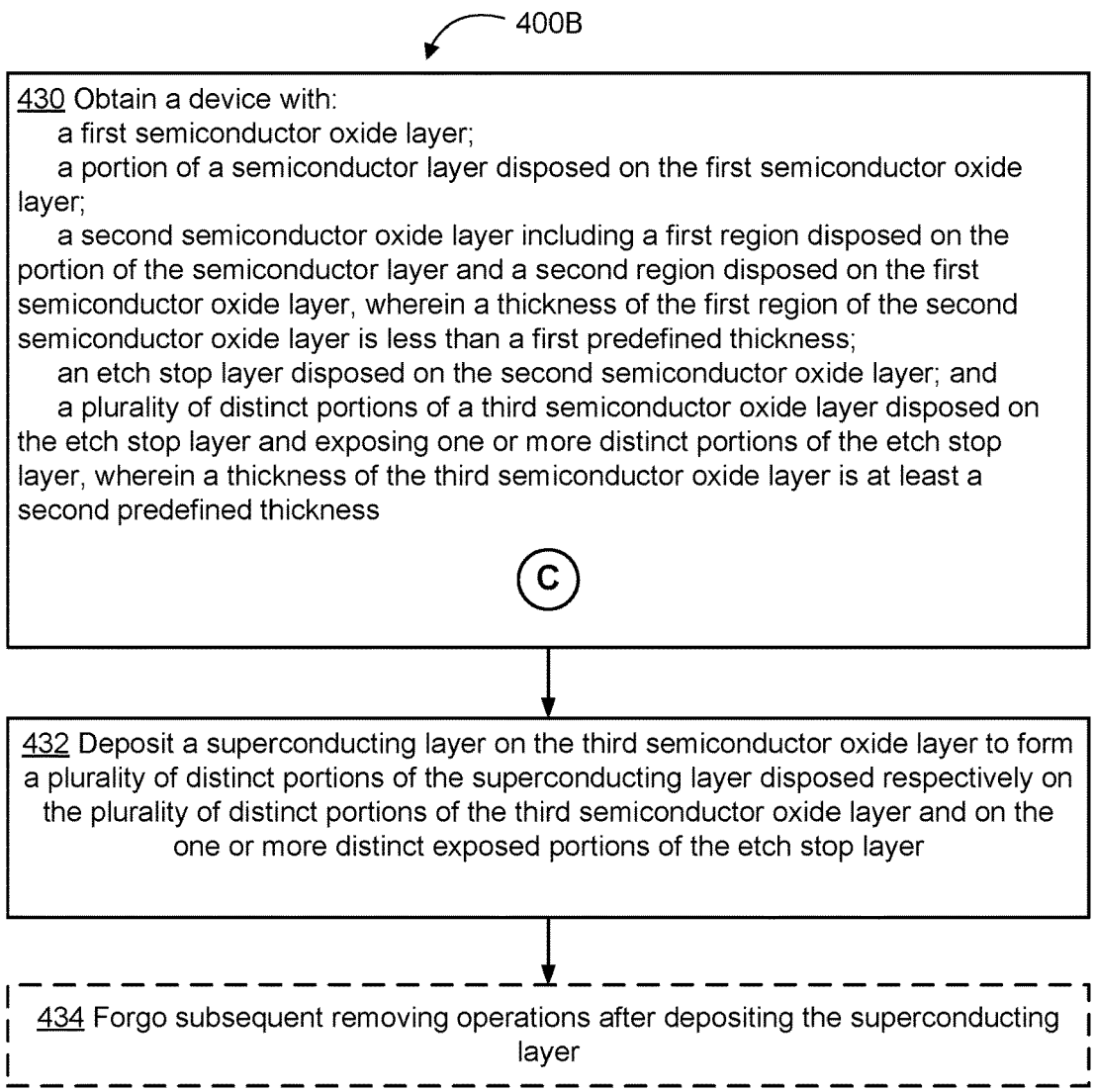

FIGS. 4D-4F are flow diagrams illustrating method 400B of forming a superconducting nanowire single-photon detector in accordance with some embodiments. In some embodiments, and as described herein, method 400B is performed by a customer who obtains a starting point device (e.g., a CMOS-compatible device, such as the device produced by method 400A) from a foundry. In some embodiments, the devices produced by method 400B correspond to the devices shown in and described herein with reference to FIGS. 2A-2I.

The method includes obtaining (430) a device (e.g., device 100-1, FIG. 2H) with: a first semiconductor oxide layer (e.g., layer 204, FIG. 2H); a portion of a semiconductor layer (e.g., portion 206a, FIG. 2H) disposed on the first semiconductor oxide layer; and a second semiconductor oxide layer (e.g., layer 208, FIG. 2H) including a first region (e.g., first region 208a, FIG. 2E) disposed on the portion of the semiconductor layer and a second region (e.g., second region 208b, FIG. 2E) disposed on the first semiconductor oxide layer. A thickness of the first region of the second semiconductor oxide layer is less than a first predefined thickness (e.g., 100 nm). The device also includes an etch stop layer (e.g., etch stop layer 210, FIG. 2H) disposed on the second semiconductor oxide layer; and a plurality of distinct portions of a third semiconductor oxide layer (e.g., layer 212, FIG. 2H) disposed on the etch stop layer and exposing one or more distinct portions of the etch stop layer. A thickness of the third semiconductor oxide layer is at least a second predefined thickness (e.g., 500 nm). In some embodiments, the thickness of the third oxide layer is large enough such that the plurality of distinct portions of the third oxide layer form deep trenches from the top surface of the third oxide layer down to the etch stop layer. In some embodiments, a width of a respective exposed portion of the etch stop layer (e.g., a width of a respective trench) is 100 nm. In some embodiments, the thickness of the third semiconductor oxide layer (the second predefined thickness) is at least a predefined multiple of (e.g., five times) the width of a respective trench.

The method also includes depositing (432) a superconducting layer (e.g., superconducting layer 214, FIG. 2I) on the third semiconductor oxide layer to form a plurality of distinct portions of the superconducting layer disposed respectively on the plurality of distinct portions of the third semiconductor oxide layer and on the one or more distinct exposed portions of the etch stop layer (e.g., to produce a superconducting nanowire single-photon detector) (e.g., as shown in and described herein with reference to FIG. 2I).

In some embodiments, the method includes forgoing (434) subsequent removing (e.g., etching) operations after depositing the superconducting layer. In some embodiments, the method includes forgoing any subsequent processing operations after depositing the superconducting layer. In some embodiments, the method includes forgoing any subsequent processing operations, other than addition (e.g., deposition) of a protective layer, after depositing the superconducting layer.

In some embodiments, the device includes (436) a substrate (e.g., substrate 202, FIG. 2I), and the first semiconductor oxide layer is disposed over the substrate.

In some embodiments, obtaining the device includes (438): obtaining a second device (e.g., device 100-1, FIG. 2G) with: the first semiconductor oxide layer; the portion of the semiconductor layer disposed on the first semiconductor oxide layer; the second semiconductor oxide layer including the first region disposed on the portion of the semiconductor layer and the second region disposed on the first semiconductor oxide layer; the etch stop layer disposed on the first semiconductor oxide layer; and the third semiconductor oxide layer. In some embodiments, obtaining the device also includes removing portions of the third semiconductor oxide layer to define the plurality of distinct portions of the third semiconductor oxide layer and to expose the one or more distinct portions of the etch stop layer (e.g., as shown in and described with reference to FIG. 2H). For example, in some embodiments, patterning of the third oxide layer is performed by the customer after obtaining the device from the foundry. In some embodiments, patterning of the third oxide layer is performed by the foundry prior to providing the device to the customer (e.g., the customer receives, from the foundry, a device with the trenches already formed).

In some embodiments, the predefined thickness is 100 nm (440).

In some embodiments, a width of a respective portion of the superconducting layer disposed on a corresponding exposed portion of the etch stop layer is 100 nm (442).

In some embodiments, a thickness of the third semiconductor oxide layer is at least 500 nm (444).

In some embodiments, the portion of the semiconductor layer is 200 nm in thickness (446).

In some embodiments, the portion of the semiconductor layer is a waveguide (448).

In some embodiments, the semiconductor layer is a silicon layer (450).

Figure 5A:
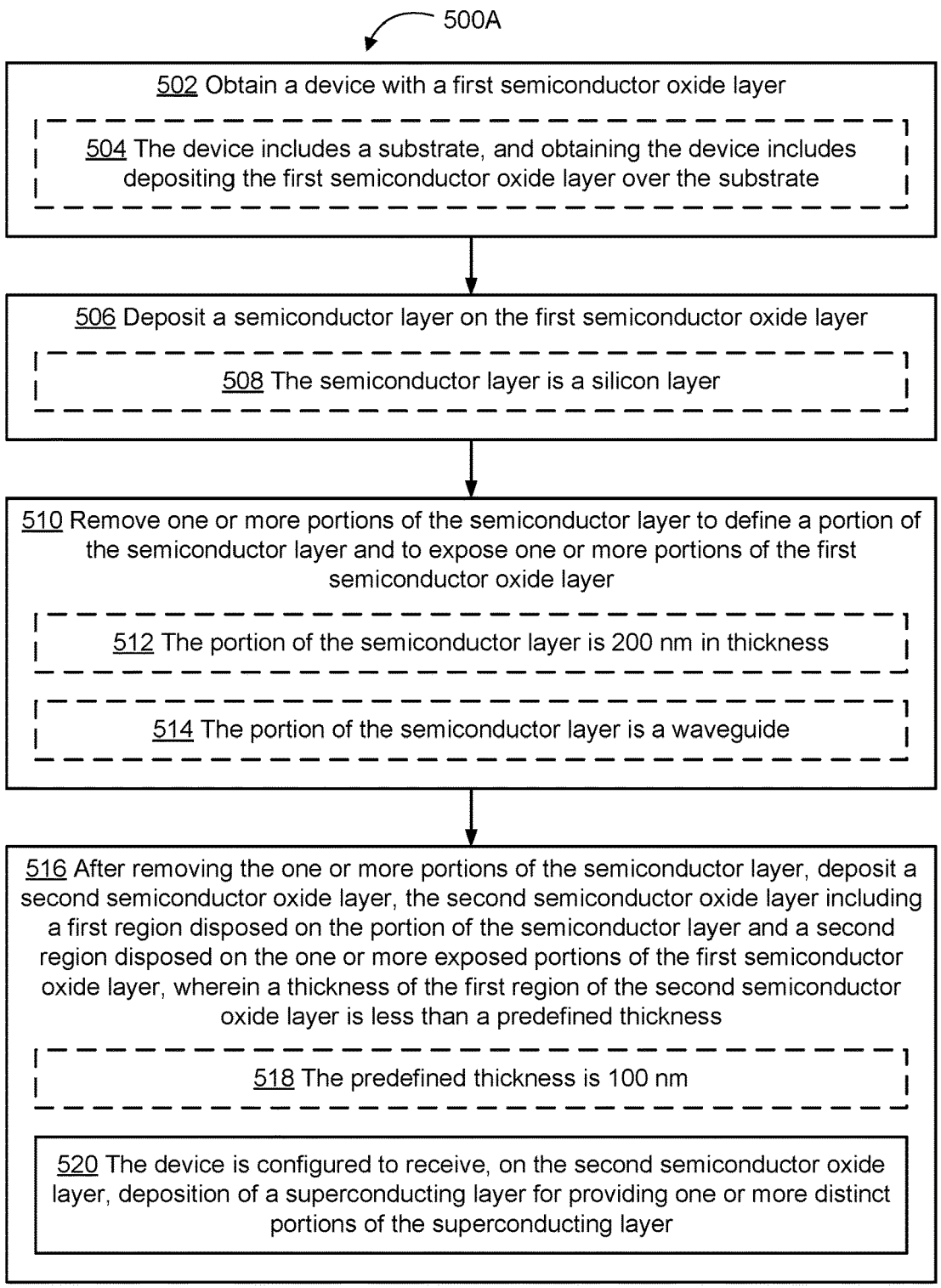
FIG. 5A is a flow diagram illustrating a method of forming a superconducting nanowire single-photon detector in accordance with some embodiments.

FIG. 5A is a flow diagram illustrating method 500A of forming a superconducting nanowire single-photon detector in accordance with some embodiments. In some embodiments, and as described herein, method 500A is performed by a foundry. In some embodiments, the device produced by method 500A is provided to a customer of the foundry for further processing. In some embodiments, the devices produced by and throughout method 500A correspond to the devices shown in and described herein with reference to FIGS. 3A-3G.

The method includes obtaining (502) a device (e.g., device 100-2, FIG. 3B) with a first semiconductor oxide layer (e.g., layer 204, FIG. 3B).

In some embodiments, the device includes (504) a substrate (e.g., substrate 202, FIG. 3B), and obtaining the device includes depositing the first semiconductor oxide layer over the substrate (e.g., on top of the substrate or with intervening layers between the substrate and the first semiconductor oxide layer) (e.g., as shown in and described herein with reference to FIG. 3B). In some embodiments, the substrate is a semiconductor substrate, such as a silicon substrate. In some embodiments, the device includes at least an intervening semiconductor (e.g., silicon) layer between the substrate and the third oxide layer (e.g., if the substrate is not a semiconductor substrate).

The method also includes depositing (506) a semiconductor layer (e.g., layer 206, FIG. 3C) on the first semiconductor oxide layer.

In some embodiments, the semiconductor layer is (508) a silicon layer.

The method includes removing (510) one or more portions of the semiconductor layer to define a portion of the semiconductor layer (e.g., portion 206a, FIG. 3D) (e.g., a waveguide) and to expose one or more portions of the first semiconductor oxide layer (e.g., corresponding portions of the first semiconductor oxide layer that were underneath the removed portions of the semiconductor layer) (e.g., as shown in and described herein with reference to FIG. 3D).

In some embodiments, the portion of the semiconductor layer is 200 nm in thickness (512).

In some embodiments, the portion of the semiconductor layer is a waveguide (514).

The method includes, after removing the one or more portions of the semiconductor layer, depositing (516) a second semiconductor oxide layer (e.g., layer 208, FIG. 3E), the second semiconductor oxide layer including a first region (e.g., first region 208a, FIG. 3E) disposed on the portion of the semiconductor layer and a second region (e.g., second region 208b, FIG. 3E) disposed on the one or more exposed portions of the first semiconductor oxide layer. A thickness of the first region of the second semiconductor oxide layer is less than a predefined thickness (e.g., the portion of the second oxide layer that is disposed on the semiconductor portion is less than 100 nm in thickness).

In some embodiments, the predefined thickness is 100 nm (518).

The device is configured (520) to receive, on the second semiconductor oxide layer, deposition of a superconducting layer for providing one or more distinct portions of the superconducting layer (e.g., to produce a superconducting nanowire single-photon detector) (e.g., as described herein with reference to superconducting layer 316, FIGS. 3F-3G). In some embodiments, the device is configured to receive deposition of a superconducting layer (e.g., the second semiconductor oxide layer has a planar surface so that superconducting layer 316 can be deposited as a single continuous layer) such that removing one or more portions of the superconducting layer to define one or more distinct (remaining) portions of the superconducting layer produces a superconducting nanowire single-photon detector.

It is noted that methods 400A and 500A do not include any processing steps involving superconducting material. In this way, production at the foundry is not affected by the introduction of new superconducting materials that may impact contamination standards and/or interrupt conventional processing flows at the facility.

FIG. 5B is a flow diagram illustrating a method of forming a superconducting nanowire single-photon detector in accordance with some embodiments. In some embodiments, and as described herein, method 500B is performed by a customer who obtains a starting point device (e.g., a CMOS-compatible device, such as the device produced by method 500A) from a foundry. In some embodiments, the devices produced by method 500B correspond to the device shown in and described herein with reference to FIGS. 3A-3G.

The method includes obtaining (530) a device (e.g., device 100-2, FIG. 3E) with: a first semiconductor oxide layer (e.g., layer 204, FIG. 3E); a portion of a semiconductor layer (e.g., portion 206a, FIG. 3E) (e.g., a waveguide) disposed on the first semiconductor oxide layer; and a second semiconductor oxide layer (e.g., layer 208, FIG. 3E) including a first region (e.g., first region 208a, FIG. 3E) disposed on the portion of the semiconductor layer and a second region (e.g., second region 208b, FIG. 3E) disposed on the first semiconductor oxide layer. A thickness of the first region of the second semiconductor oxide layer is less than a predefined thickness.

In some embodiments, the device includes (532) a substrate (e.g., substrate 202, FIG. 3E), and the first semiconductor oxide layer is disposed over the substrate.

In some embodiments, the predefined thickness is 100 nm (534).

In some embodiments, the portion of the semiconductor layer is 200 nm in thickness (536).

In some embodiments, the portion of the semiconductor layer is a waveguide (538).

In some embodiments, the semiconductor layer is a silicon layer (540).

The method includes depositing (542) a superconducting layer (e.g., superconducting layer 316, FIG. 3F) on the device.

The method includes removing (544) one or more portions of the superconducting layer to define one or more distinct (remaining) portions of the superconducting layer to produce a superconducting nanowire single-photon detector (e.g., as shown in and described herein with reference to FIG. 3G).

Many modifications and variations of this disclosure can be made without departing from its spirit and scope, as will be apparent to those skilled in the art. The specific embodiments described herein are offered by way of example only, and the disclosure is to be limited only by the terms of the appended claims, along with the full scope of equivalents to which such claims are entitled.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best use the invention and various embodiments with various modifications as are suited to the particular use contemplated.

What is claimed is:

1. A device, comprising:

a first semiconductor oxide layer;

a portion of a semiconductor layer disposed on the first semiconductor oxide layer;

a second semiconductor oxide layer including a first region disposed on the portion of the semiconductor layer and a second region disposed on the first semiconductor oxide layer, wherein a thickness of the first region of the second semiconductor oxide layer is less than a predefined thickness; and one or more distinct regions of a superconducting layer disposed on the second semiconductor oxide layer over the portion of the semiconductor layer.

2. The device of claim 1, wherein the first semiconductor oxide layer is disposed over a substrate.

3. The device of claim 1, wherein the predefined thickness is 100 nm.

4. The device of claim 1, wherein the portion of the semiconductor layer is 200 nm in thickness.

5. The device of claim 1, wherein the portion of the semiconductor layer is a waveguide.

6. The device of claim 1, wherein the semiconductor layer is a silicon layer.

* * * * *